United States Patent [19]

Shrivastava et al.

[11] Patent Number: 5,731,606

[45] Date of Patent: Mar. 24, 1998

[54] RELIABLE EDGE CELL ARRAY DESIGN

[76] Inventors: Ritu Shrivastava, 44455 Parkmeadow Dr., Fremont, Calif. 94539; Chitranjan N. Reddy, 3099 N. First St., San Jose, Calif. 95134

[21] Appl. No.: 454,750

[22] Filed: May 31, 1995

[51] Int. Cl.$^6$ ................................................. H01L 27/10
[52] U.S. Cl. ..................... 257/202; 257/204; 257/390; 257/443; 257/494; 257/495; 257/923; 257/925
[58] Field of Search ............................... 257/202, 204, 257/390, 391, 443, 494, 495, 923, 925

[56] References Cited

U.S. PATENT DOCUMENTS

| | | | |
|---|---|---|---|
| 5,051,917 | 9/1991 | Gould et al. | 364/489 |
| 5,184,204 | 2/1993 | Mihara et al. | 257/494 X |
| 5,545,915 | 8/1996 | Disney et al. | 257/491 |

FOREIGN PATENT DOCUMENTS

| | | | |
|---|---|---|---|
| 0283046 | 9/1988 | European Pat. Off. | 257/494 |
| 58-108771 | 6/1983 | Japan | 257/494 |
| 58-95855 | 6/1983 | Japan | 257/202 |
| 63-58942 | 3/1988 | Japan | 257/204 |
| 63-197356 | 8/1988 | Japan | 257/202 |
| 2021636 | 1/1990 | Japan | 257/202 |
| 3006864 | 1/1991 | Japan | 257/494 |
| 4043665 | 2/1992 | Japan | 257/202 |
| 4246858 | 9/1992 | Japan | 257/202 |

*Primary Examiner*—William Mintel
*Attorney, Agent, or Firm*—Limbach & Limbach L.L.P.

[57] ABSTRACT

Techniques are provided for protecting the cells of an array against deleterious effects of, for example, photolithography, etching and charge contamination. The cell array is designed to have edge cells modified at layout, or inactive edge cells, or guardrings surrounding the active array to contain the above effects, leaving the active cells highly reliable and with identical behavior.

8 Claims, 4 Drawing Sheets

Additional Cell Layouts (inside outer shaded area)

Additional Cell Layouts
(inside outer shaded area)

RELIABLE EDGE CELL ARRAY DESIGN

BACKGROUND OF THE INVENTION

1. Field of the Invention

The present invention relates to semiconductor integrated circuits that include an array of repeated cells and, in particular, to methods of protecting active array cells against deleterious effects of photolithography, etching, and charge contamination (such as mobile ions, or H+ protons) by designing the array to have modified edge cells, or extra nonactive cells, or a guardring surrounding the active array to contain the above effects, leaving the active cells highly reliable and with identical behavior.

2. Discussion of the Related Art

As the dimensions of integrated circuit die shrink, several second order effects which were not important at lower densities come into play. Examples of such effects are discussed below.

Isolated or edge cells on a wafer may have different critical dimensions after lithography and etching compared to identically laid out cells that are embedded in the middle of other cells. The different dimensions of these edge cells can result in electrical properties that are different from the inner cells of the array. For example, in a DRAM array, the edge cells may have lower capacitance if the cell capacitor comes out smaller on the wafer. In an EPROM, Flash EPROM or EEPROM cell array, the edge cells may have a lower coupling coefficient if the floating polysilicon endcap for the edge cells is smaller. In an SRAM cell array, an edge cell may leak if it has narrower poly defining the device channel length.

FIG. 1 represents an arbitrary key layer of a cell array on a wafer after fabrication processing. In the layout, i.e. prior to processing, all cells in the layout were identical. However, after processing, the edge cells are shown reduced in their dimensions. The corner cells suffer the worse effect. In certain types of processing and mask polarity, it is conceivable that the dimensions may actually increase.

Another aspect of the edge cells relates to reliability problems due to contamination. In most designs, the cells are the most sensitive devices on the chip. Any contamination that may result from processing of the wafer, or that may be introduced afterwards in steps such as laser fuse repair (which results in a hole through the dielectric layers), can find its way through sneak paths to the cell array. Mobile ion contamination, for example, can cause "bake reversible failures (BRFs)" where the cells fail due to accumulated contamination, and the failures can be reversed after a bake. Mobile ion contamination is usually attracted by the lowest potential regions in the edge cells. The contaminated active edge cells then cause the entire device to fail.

Another aspect of the edge cells relates to reliability problems due to injected carriers. The injected carriers may be a result of "hot carriers" which are encountered in submicron devices in certain bias regions, or they may be carriers which sneak through from intentionally designed circuits such as substrate bias generators. Again, the edge cells are the worst affected and can cause the device to fail.

SUMMARY OF THE INVENTION

The present invention provides several techniques for preventing an active cell array from failing due to various causes such as photolithography and etching effects, contamination, and injected carriers.

According to a first technique, the edge cells of the array are modified in layout to compensate for the processing anomalies causing the failure mode. For example, in a DRAM cell, the capacitor plate layout can be modified so that the edge cell capacitor dimensions, despite unequal processing with respect to inner cell capacitors, are same as the inner cells. The edge cells in this case remain active, but do not fail because of processing anomalies.

According to a second technique, the "active" array is surrounded by "inactive" cells. These inactive cells can either be identical to the inner active cells or may be different. The inactive cells restrict the various effects described above to themselves, leaving the active cells reliable and identical to each other in performance.

According to a third technique, the active cells are surrounded by "guardrings" to protect the cells from failures due to contamination or injected carriers. The guardrings are structures made of diffusion (or active) regions, well regions, polysilicon, contacts, metal, or a combination thereof. Biasing of these guardrings can be designed either to attract the contamination/carriers, thus containing them, or to repel them to contain them in a specified region. This is accomplished by biasing the guardrings either positive or negative. In the prior art, guardrings consisting of metal and contacts have been used as a die seal to physically stop contamination. In the present invention, a guardring is used to electrically stop the contamination or carriers even though there is no mechanical seal.

These and other objects and advantages of the present invention will become obvious to those of ordinary skill in the art after having read the following detailed description of the preferred embodiments which are illustrated in the various figures.

DETAILED DESCRIPTION OF THE PREFERRED EMBODIMENTS

The following detailed description is of the best modes presently contemplated by the inventor for practicing the invention. It should be understood that the description of these preferred embodiments is merely illustrative and should not be taken as limiting.

Figure 1:
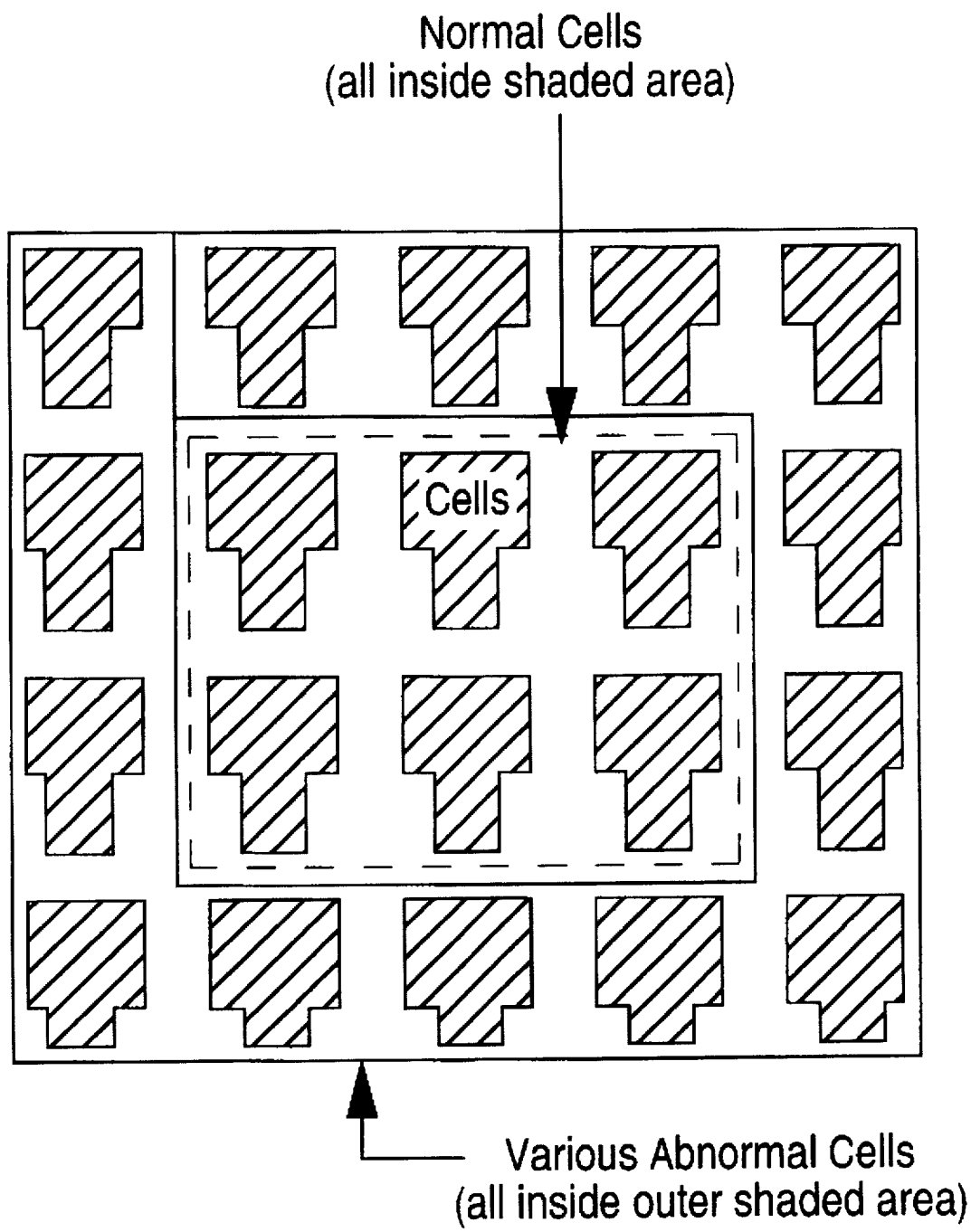
FIG. 1 is a schematic drawing illustrating how the edge cell on a wafer can be different from inner cells; only one arbitrary key layer of the device is shown for illustration.
Figure 2:
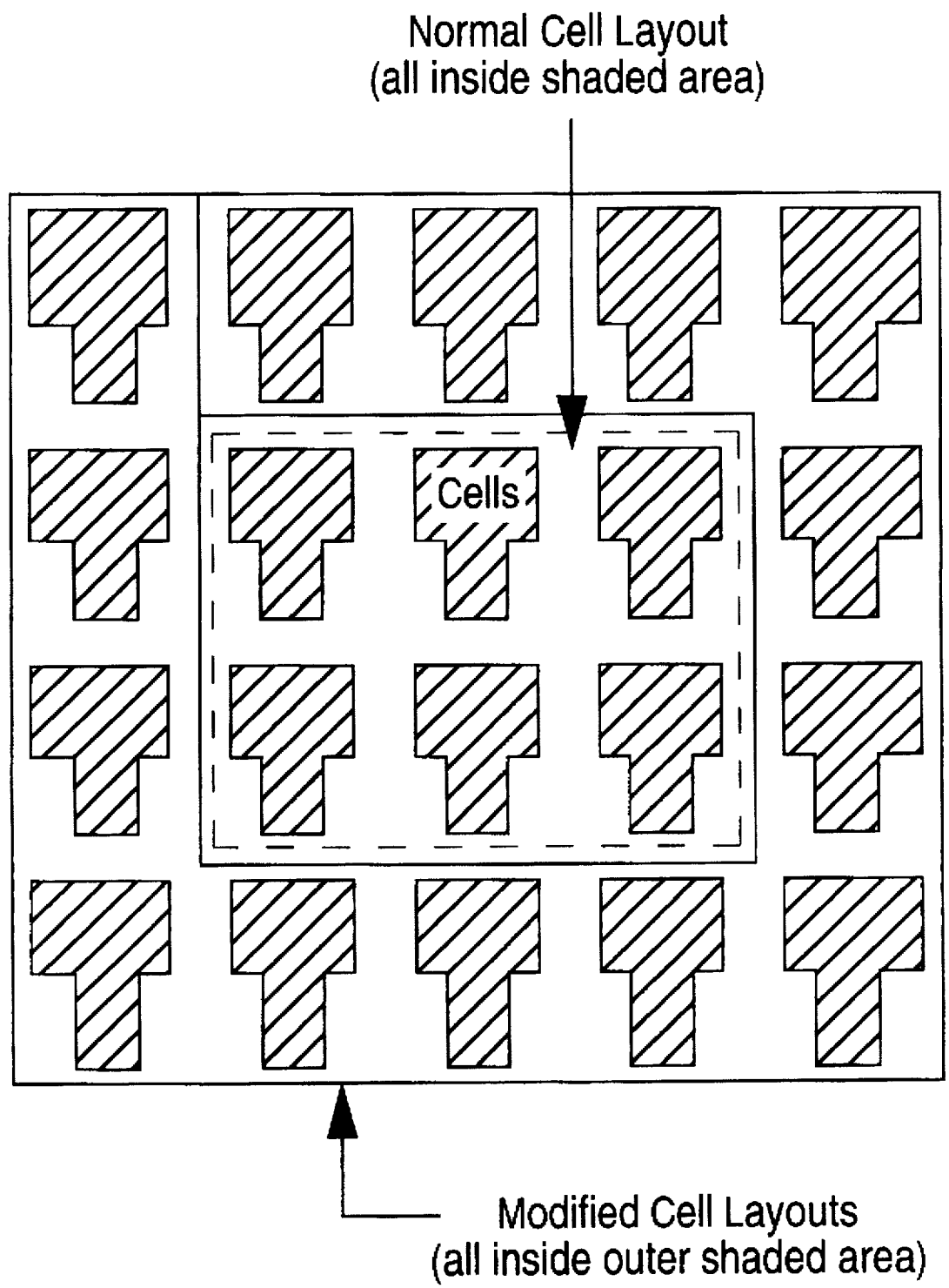
FIG. 2 is a schematic drawing illustrating how, in accordance with the invention, an active edge cell can be made different from inner cells at layout.

As shown in FIG. 2, in accordance with one aspect of the present invention, the edge cells (shown in the layout) of a cell array have been purposely sized to compensate for processing effects. The corner cells have been sized in both x and y dimensions. The resulting dimensions on the wafer are not shown, but it is assumed that, ideally, all of the cells measure the same after processing. The illustrated effect becomes more important when the dimensions are in the submicron range. However, some effects exist in any technology. The layer shown can be any single layer or combination of layers critical to the operation of the cell. Some examples are diffusion, poly, and contact layers. In summary, this aspect of the invention uses edge cells that are sized differently at layout compared to inner cells for process compensation.

Figure 3:
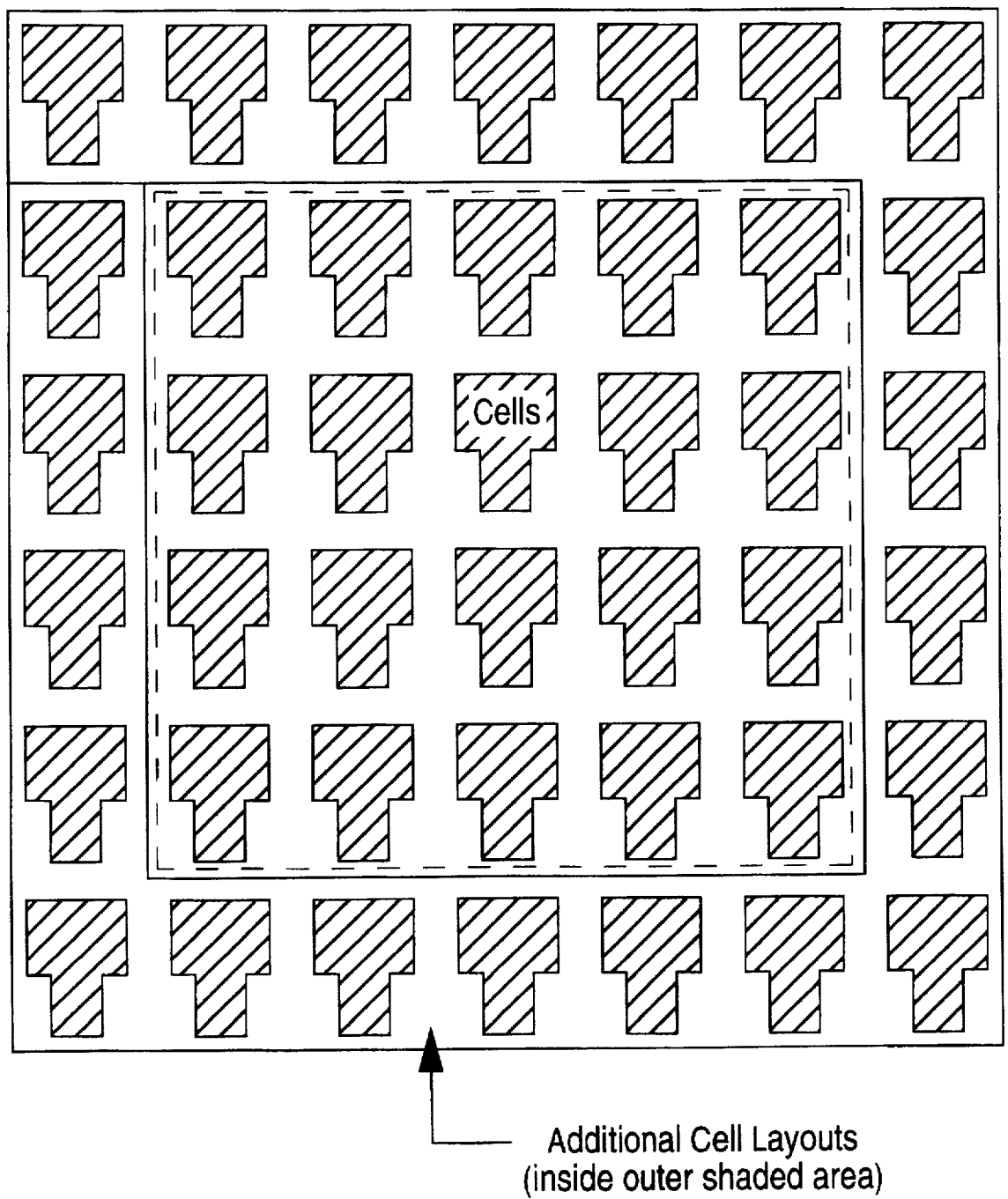
FIG. 3 is a schematic drawing illustrating the use of inactive edge cells to control contamination, in accordance with the invention.

The technique described in conjunction with FIG. 2 works if the semiconductor process has been characterized to result in a critical dimension which does not vary much from wafer to wafer or lot to lot. A second technique, shown in FIG. 3, may be used if the process results in dimensions which are not reproducible. According to this technique, an additional row and column of inactive cells is introduced which may have different dimensions than the inner cells on the wafer after processing. However, since these inactive cells do not take part in the operation of the circuit, their impact is minimal. The additional area taken by the inactive cells becomes a small fraction of the overall die area as the cell density increases. The inner cells, thus, are identical in dimensions and the problem is eliminated. If one cell does not provide the required protection for the inner array cells, then more than one cell layer can be incorporated in each direction. In some cases, the protective layer may be sacrificed during processing by an etching process, while still having provided protection to interior existing cell layers.

The extra cells can provide an added advantage. By biasing these nonactive cells electrically, charged contamination can be stopped from going into the inner array. For example, a positive bias on these extra cells will create an electric field which will repel any positive mobile ion contamination, whereas a low potential will attract and stop any mobile ion contamination from going into inner cells. In either case, the extra cells help contain the mobile ion type contamination. In summary, this second aspect of the invention uses extra edge cells to obtain identical inner cells after processing.

Figure 4B:
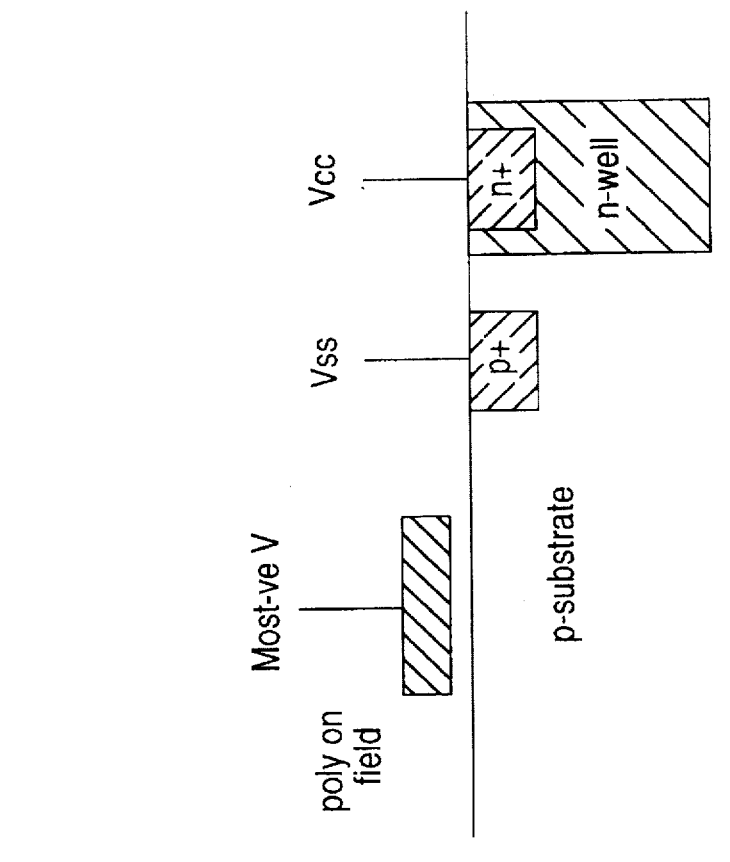
FIGS. 4a and 4b are a layout and cross-section, respectively, illustrating examples of guardrings (a polysilicon guardring biased to a negative voltage, a p+ tap guardring biased to Vss, and an n−well/n+ guardring biased to Vcc) for eliminating any leakage or contamination, in accordance with the invention.
Figure 4A:
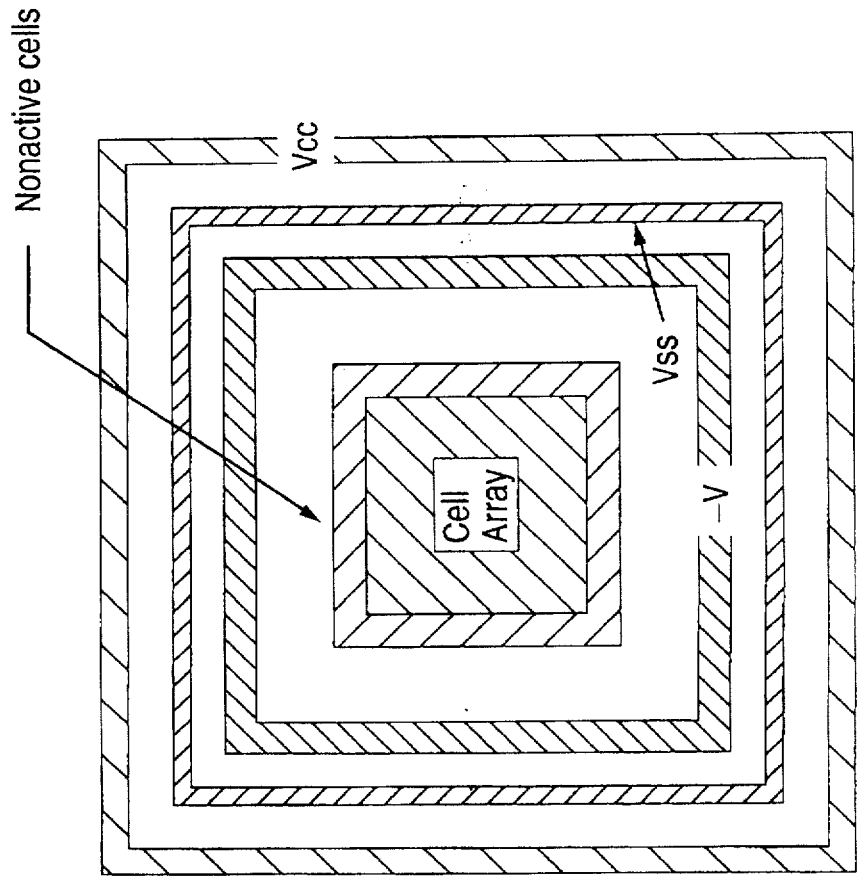

To prevent the contamination from affecting the inner cells, a third technique is used, either in addition to or in place of the previously discussed techniques. According to this technique, guardrings surround the cell array. The guardrings may be designed in a variety of ways. Preferred embodiments are shown in FIGS. 4a and 4b. In several technologies, such as nonvolatile memories, the inner cells need to be isolated from the peripheral circuits. In 5V programmable flash EPROMs, negative voltage (e.g., −10V) on the gate is often used to erase the memory cells. This aspect of the invention utilizes this negative voltage by applying it to the polysilicon guardring to "capture" any contamination from going into the cell array. If there are other circuits present in the periphery which produce free electrons or holes, the guardrings can also be used to prevent these carriers from affecting the cell operation. These carriers can result from a variety of sources, such as substrate current resulting from hot electron injection, or a charge pump injecting electrons into the substrate, or an externally applied voltage to a pad injecting into the substrate. By surrounding the memory core with an electrically biased layer in silicon or in the dielectric above the silicon, such carriers can be prevented from migrating into the array. As shown in FIGS. 4a and 4b, a p+ tap in a p-substrate biased to Vss collects the majority carriers (holes) in the p-substrate. Injected minority carriers are collected by an n+ tap/n−well guardring on the p-substrate biased to Vcc. The guardrings described above can be used separately or together. FIGS. 4a and 4b show all of them being used together to prevent the cells from all effects.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. An array of cells formed in an integrated circuit structure, a cell being defined by a combination of layers, each layer representing the presence of material selected from conductive material, dielectric material and combinations thereof, in combination with a semiconductor substrate, the array comprising:

a plurality of inner cells forming an active cell array such that the inner cells are formed identically; and at least one layer of edge cells modified with respect to the inner cells at layout so as to compensate for dimension changes during processing;

the modification being dependent on the location of the edge cells with respect to the inner cells.

2. An array as in claim 1 wherein said array includes a plurality of said edge cell layers of edge cells.

3. An array of cells formed in an integrated circuit structure, a cell being defined by a combination of layers, each layer representing the presence of material selected from conductive material, dielectric material and combinations thereof, in combination with a semiconductor substrate, the array comprising:

a plurality of active cells forming an active cell array such that the active cells are formed identically;

extra nonactive edge cells at the periphery of the active cell array so as to prevent dimensional changes in the active cells during processing.

4. An array as in claim 3 wherein said array includes a plurality of layers of extra nonactive edge cells.

5. An array of cells formed in an integrated circuit structure, a cell being defined by a combination of layers, each layer representing the presence material selected from conductive material, dielectric material and combinations thereof, in combination with a semiconductor substrate, the array comprising:

a plurality of active cells forming an active cell array requiring isolation from mobile contamination; and extra nonactive edge cells formed at the periphery of the active cell array and biased to an electrical potential so as to prevent contamination from affecting the active cells.

6. An array as in claim 5 wherein said array includes a plurality of layers of extra nonactive edge cells.

7. An array of cells formed in an integrated circuit structure, a cell being defined by a combination of layers, each layer representing the presence of material selected from conductive material, dielectric material and combinations thereof, in combination with a semiconductor substrate, the array comprising:

a plurality of inner cells forming an active cell array requiring isolation from electrical carriers such as injected electrons and holes, such carriers introduced during the operation of the active cell array; and extra nonactive edge cells formed at the periphery of the active cell array and biased to an electrical potential so as to prevent the carriers from affecting the inner cells.

8. An array as in claim 7 wherein said array includes a plurality of layers of extra nonactive edge cells.

* * * * *